US012369250B2

United States Patent
Lin et al.

(10) Patent No.: US 12,369,250 B2
(45) Date of Patent: Jul. 22, 2025

(54) CIRCUIT BOARD STRUCTURE AND MANUFACTURING METHOD THEREOF

(71) Applicant: Unimicron Technology Corp., Taoyuan (TW)

(72) Inventors: Ping-Tsung Lin, Miaoli County (TW); Kai-Ming Yang, Hsinchu County (TW); Chia-Yu Peng, Taoyuan (TW); Pu-Ju Lin, Hsinchu (TW); Cheng-Ta Ko, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 305 days.

(21) Appl. No.: 17/986,899

(22) Filed: Nov. 15, 2022

(65) Prior Publication Data

US 2024/0138063 A1   Apr. 25, 2024
US 2024/0237209 A9   Jul. 11, 2024

(30) Foreign Application Priority Data

Oct. 21, 2022 (TW) .................................. 111139982

(51) Int. Cl.
  *H05K 1/02*   (2006.01)
  *H05K 1/11*   (2006.01)
  (Continued)

(52) U.S. Cl.
  CPC ............. *H05K 1/114* (2013.01); *H05K 1/024* (2013.01); *H05K 3/3442* (2013.01);
  (Continued)

(58) Field of Classification Search
  CPC ........... H01L 21/4857; H01L 21/76816; H01L 21/76871; H01L 2224/131;
  (Continued)

(56) References Cited

U.S. PATENT DOCUMENTS

| 6,577,003 B1 * | 6/2003 | Crane, Jr. ............ H05K 7/1084 257/692 |
| 2020/0027804 A1 * | 1/2020 | Fang ........................ H01L 24/11 |

(Continued)

FOREIGN PATENT DOCUMENTS

| KR | 20010095553 A | * 11/2001 | ............. H01L 29/00 |
| TW | I398936 | 6/2013 | |

*Primary Examiner* — Timothy J Thompson
*Assistant Examiner* — Guillermo J Egoavil
(74) *Attorney, Agent, or Firm* — JCIPRNET

(57) ABSTRACT

A circuit board structure includes a carrier, a thin film redistribution layer disposed on the carrier, solder balls electrically connected to the thin film redistribution layer and the carrier, and a surface treatment layer. The thin film redistribution layer includes a plurality of pads, a first dielectric layer, a first metal layer, a second dielectric layer, a second metal layer, and a third dielectric layer. A plurality of first openings of the first dielectric layer expose part of the pads, and a first surface of the first dielectric layer is higher upper surfaces of the pads. The solder balls are disposed in a plurality of third openings of the third dielectric layer and are electrically connected to the second metal layer and the carrier. The surface treatment layer is disposed on the upper surfaces, and a top surface of the surface treatment layer is higher than the first surface.

16 Claims, 15 Drawing Sheets

(51) Int. Cl.
*H05K 3/34* (2006.01)
*H05K 3/40* (2006.01)

(52) U.S. Cl.
CPC ... *H05K 3/4007* (2013.01); *H05K 2201/0195* (2013.01); *H05K 2203/041* (2013.01)

(58) Field of Classification Search
CPC . H01L 2224/16227; H01L 2224/16238; H01L 2224/32225; H01L 2224/32245; H01L 2224/73253; H01L 23/367; H01L 23/3677; H01L 23/481; H01L 23/49816; H01L 23/49822; H01L 23/5226; H01L 24/13; H01L 24/16; H01L 24/32; H01L 24/43; H01L 24/48; H01L 2924/014; H01L 2924/1517; H01L 2924/15311; H05K 1/024; H05K 1/114; H05K 1/141; H05K 1/02; H05K 1/11; H05K 1/0271; H05K 2201/0195; H05K 2201/068; H05K 2201/09918; H05K 2203/041; H05K 3/3442; H05K 2203/061; H05K 3/368; H05K 3/4007; H05K 3/4682; H05K 3/34; H05K 3/40; H05K 3/4623; H05K 3/4638; H05K 3/4661
USPC .................................. 174/250, 262; 257/784
See application file for complete search history.

(56) References Cited

U.S. PATENT DOCUMENTS

2021/0050651 A1* 2/2021 Jung ...................... H01Q 25/00
2023/0012399 A1* 1/2023 Lee ......................... H01L 24/20

* cited by examiner

CIRCUIT BOARD STRUCTURE AND MANUFACTURING METHOD THEREOF

CROSS-REFERENCE TO RELATED APPLICATION

This application claims the priority benefit of Taiwan application serial no. 111139982, filed on Oct. 21, 2022. The entirety of the above-mentioned patent application is hereby incorporated by reference herein and made a part of this specification.

BACKGROUND

Technical Field

The disclosure relates to a substrate structure and a manufacturing method thereof, and in particular, relates to a circuit board structure and a manufacturing method thereof.

DESCRIPTION OF RELATED ART

Nowadays, electronic products exhibit multiple functions and stronger performance, and the number of I/Os required by the products also increases, so the pad size and the pad pitch of the products accordingly decrease. In addition, the above requirements also make it difficult to manufacture the surface treatment process. Especially for fine space products, since the surface treatment process is performed after the temporary carrier is removed, it is easy to cause bridge issues and electrical short circuits.

SUMMARY

The disclosure provides a circuit board structure exhibiting good structural reliability.

The disclosure further provides a manufacturing method of a circuit board structure configured to manufacture the abovementioned circuit board structure.

A circuit board structure provided by the disclosure includes a carrier, a thin film redistribution layer, a plurality of solder balls, and a surface treatment layer. The thin film redistribution layer is disposed on the carrier. The thin film redistribution layer includes a plurality of pads, a first dielectric layer, a first metal layer, a second dielectric layer, a second metal layer, and a third dielectric layer. The first dielectric layer has a first surface and a second surface opposite to each other and a plurality of first openings extending from the second surface towards the first surface. The first openings expose part of the pads, and the first surface is higher than an upper surface of each of the pads. The first metal layer is disposed on the second surface of the first dielectric layer and extends into the first openings. The second dielectric layer covers the first dielectric layer and the first metal layer and has a plurality of second openings exposing part of the first metal layer. The second metal layer is disposed on the second dielectric layer, extends into the second openings, and is electrically connected to the first metal layer. The third dielectric layer covers the second dielectric layer and the second metal layer and has a plurality of third openings exposing part of the second metal layer. The solder balls are disposed in the third openings of the third dielectric layer of the thin film redistribution layer, and the solder balls are electrically connected to the second metal layer of the thin film redistribution layer and the carrier. The surface treatment layer is disposed on the upper surface of each of the pads, and a top surface of the surface treatment layer is higher than the first surface of the first dielectric layer.

In an embodiment of the disclosure, the surface treatment layer includes a first surface treatment layer and a second surface treatment layer. A first thickness of the first surface treatment layer is greater than a second thickness of the second surface treatment layer.

In an embodiment of the disclosure, the first dielectric layer further includes a plurality of fourth openings extending from the first surface towards the second surface. The fourth openings at least expose the upper surfaces of the pads. The first surface treatment layer is disposed in each of the fourth openings and protrudes from the first surface of the first dielectric layer. The second surface treatment layer covers the first surface treatment layer.

In an embodiment of the disclosure, the first dielectric layer further includes a plurality of fourth openings extending from the first surface towards the second surface. The fourth openings expose part of the first metal layer and are defined as the pads. The first surface treatment layer is disposed in each of the fourth openings, and the second surface treatment layer is disposed on the first surface treatment layer and protrudes from the first surface of the first dielectric layer.

In an embodiment of the disclosure, the circuit board structure further includes a patterned seed layer disposed on the first metal layer. The first dielectric layer further includes a plurality of fourth openings extending from the first surface towards the second surface. The fourth openings expose part of the patterned seed layer and are defined as the pads. The first surface treatment layer is disposed in each of the fourth openings and is aligned with the first surface of the first dielectric layer. The second surface treatment layer is disposed on the first surface treatment layer.

In an embodiment of the disclosure, the circuit board structure further includes an underfill filled between the third dielectric layer of the thin film redistribution layer and the carrier and covering the solder balls.

In an embodiment of the disclosure, a peripheral surface of the thin film redistribution layer is aligned with a peripheral surface of the underfill and a peripheral surface of the carrier.

A manufacturing method of a circuit board structure provided by the disclosure includes the following steps. A thin film redistribution layer is formed on a temporary carrier. The thin film redistribution layer includes a metal layer, a first dielectric layer, a first metal layer, a second dielectric layer, a second metal layer, and a third dielectric layer. The metal layer and the first dielectric layer are formed on the temporary carrier. The first dielectric layer has a plurality of first openings exposing part of the metal layer. The first metal layer is formed on the first dielectric layer, extends into the first openings, and is electrically connected to the metal layer. The second dielectric layer covers the first dielectric layer and the first metal layer and has a plurality of second openings exposing part of the first metal layer. The second metal layer is disposed on the second dielectric layer, extends into the second openings, and is electrically connected to the first metal layer. The third dielectric layer covers the second dielectric layer and the second metal layer and has a plurality of third openings exposing part of the second metal layer. Thin film redistribution layer is assembled onto a carrier through a plurality of solder balls. The solder balls are located in the third openings of the third dielectric layer, and the solder balls are electrically connected to the second metal layer and the carrier. After the thin film redistribution layer is assembled onto the carrier, the temporary carrier is removed to expose a first surface of the first dielectric layer and the metal layer, and at least part of the metal layer is removed to form a plurality of pads. The first surface of the first dielectric layer is higher than an upper surface of each of the pads. A surface treatment layer is formed on the upper surface of each of the pads. A top surface of the surface treatment layer is higher than the first surface of the first dielectric layer.

In an embodiment of the disclosure, the temporary carrier includes a glass substrate, a release film, and a seed layer. The release film is located between the glass substrate and the seed layer. The step of forming the thin film redistribution layer on the temporary carrier includes the following steps. The metal layer is formed on the seed layer. The first dielectric layer is formed on the release film. The first dielectric layer covers the metal layer, and the first openings expose part of the metal layer. A first patterned seed layer and the first metal layer thereon are formed on the first dielectric layer and the metal layer. The second dielectric layer is formed on the first dielectric layer. A second patterned seed layer and the second metal layer thereon are formed on the second dielectric layer and in the second openings. The third dielectric layer is formed on the second dielectric layer.

In an embodiment of the disclosure, the manufacturing method of the circuit board structure further includes the following step. After the temporary carrier is removed and before at least part of the metal layer is removed to form the pads, an electroplating seed layer is formed on a side of the carrier relatively away from the thin film redistribution layer. A plating resist layer is formed on the electroplating seed layer, and part of the electroplating seed layer is exposed to form a plurality of electroplating contact points.

In an embodiment of the disclosure, the step of forming the surface treatment layer includes the following step. An electroplating process is performed with the electroplating contact points to form the surface treatment layer on the upper surface of each of the pads. The surface treatment layer includes a first surface treatment layer and a second surface treatment layer. A first thickness of the first surface treatment layer is greater than a second thickness of the second surface treatment layer.

In an embodiment of the disclosure, the step of removing at least part of the metal layer includes the following step. The seed layer and part of the metal layer are removed by etching to form the pads. The first dielectric layer forms a plurality of fourth openings extending from the first surface towards the second surface. The fourth openings at least expose the upper surfaces of the pads. The first surface treatment layer is formed in each of the fourth openings and protrudes from the first surface of the first dielectric layer. The second surface treatment layer covers the first surface treatment layer.

In an embodiment of the disclosure, the step of removing at least part of the metal layer includes the following step. The seed layer, the metal layer, and part of the first patterned seed layer are completely removed by etching, and part of the first metal layer is exposed to be defined as the pads. The first dielectric layer forms a plurality of fourth openings extending from the first surface towards the second surface. The fourth openings at least expose the upper surfaces of the pads. The first surface treatment layer is formed in each of the fourth openings. The second surface treatment layer is formed on the first surface treatment layer and protrudes from the first surface of the first dielectric layer.

In an embodiment of the disclosure, the step of removing at least part of the metal layer includes the following step. The seed layer and the metal layer are completely removed by etching, and part of the first patterned seed layer is exposed to be defined as the pads. The first dielectric layer forms a plurality of fourth openings extending from the first surface towards the second surface. The fourth openings at least expose the upper surfaces of the pads. The first surface treatment layer is formed in each of the fourth openings and is aligned with the first surface of the first dielectric layer. The second surface treatment layer is formed on the first surface treatment layer.

In an embodiment of the disclosure, the manufacturing method of the circuit board structure further includes the following step. Before the temporary carrier is removed, an underfill is filled between the third dielectric layer of the thin film redistribution layer and the carrier and covers the solder balls.

In an embodiment of the disclosure, the manufacturing method of the circuit board structure further includes the following step. After the step of forming the surface treatment layer, a singulation process is performed to cut the thin film redistribution layer, the underfill, and the carrier, so that a peripheral surface of the thin film redistribution layer is aligned with a peripheral surface of the underfill and a peripheral surface of the carrier.

Based on the above, in the design of the circuit board structure provided by the disclosure, the first surface of the first dielectric layer is higher than the upper surface of each of the pads. That is, the first dielectric layer may be regarded as a dam, which can effectively prevent the surface treatment layer subsequently formed on the pads from being electrically short-circuited due to the bridge issue caused by the fine space. Therefore, the circuit board structure provided by the disclosure may exhibit good structural reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A to FIG. 1M are cross-sectional schematic views of a manufacturing method of a circuit board structure according to an embodiment of the disclosure. Regarding a manufacturing method of a circuit board provided by this embodiment, first, with reference to FIG. 1A, a temporary carrier 1 is provided. The temporary carrier 1 includes a glass substrate 2, a release film 4, and a seed layer 6, and the release film 4 is located between the glass substrate 2 and the seed layer 6. The material of the seed layer 6 is, for example, titanium, but not limited thereto.

Figure 1A:
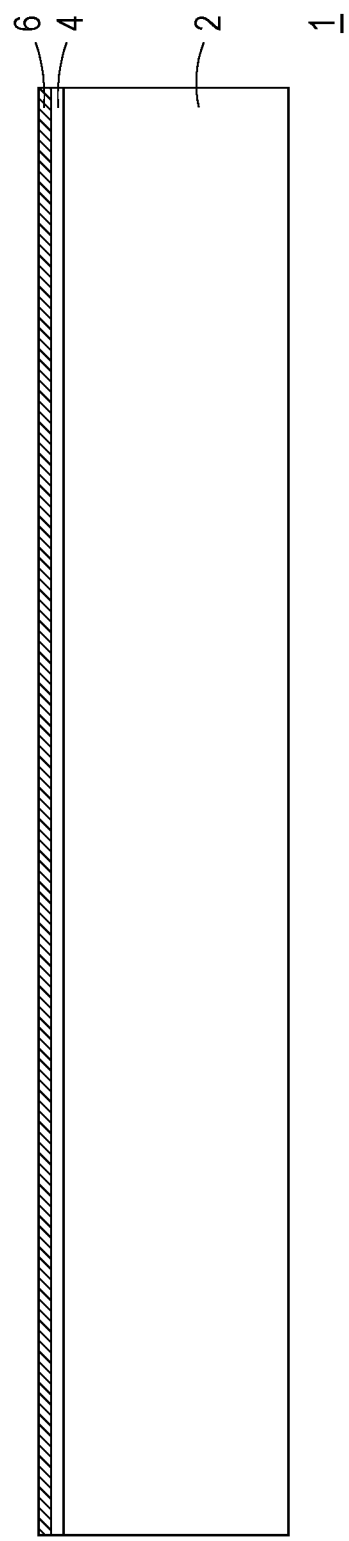
FIG. 1A to FIG. 1M are cross-sectional schematic views of a manufacturing method of a circuit board structure according to an embodiment of the disclosure.
Figure 1B:
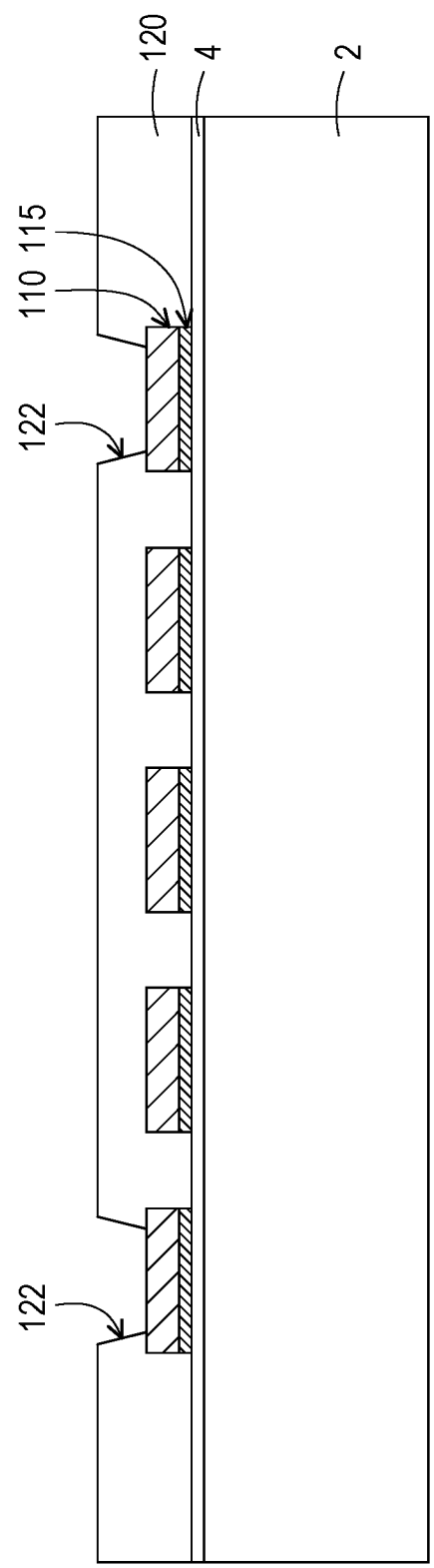

Next, with reference to FIG. 1A and FIG. 1B together, a patterned photoresist layer (not shown) is formed on the seed layer 6. Next, an electroplating process is performed on the seed layer 6 to form a metal material layer (not shown) on the seed layer 6 exposed by the patterned photoresist layer. Afterwards, the patterned photoresist layer and the underlying seed layer are removed by lift-off and etching, and a metal layer 110 is formed on a seed layer 115.

Next, with reference to FIG. 1B again, a first dielectric layer 120 is formed on the release film 4. The first dielectric layer 120 covers the metal layer 110 and has a plurality of first openings 122, and the first openings 122 expose part of the metal layer 110. Herein, the material of the first dielectric layer 120 includes but not limited to, for example, silicon dioxide, a photo imageable dielectric (PID, e.g., polyimide (PI) and polybenzoxazole (PBO)) layer, and a non-photo imageable dielectric (e.g., ajinomoto build-up film (ABF)).

Figure 1C:
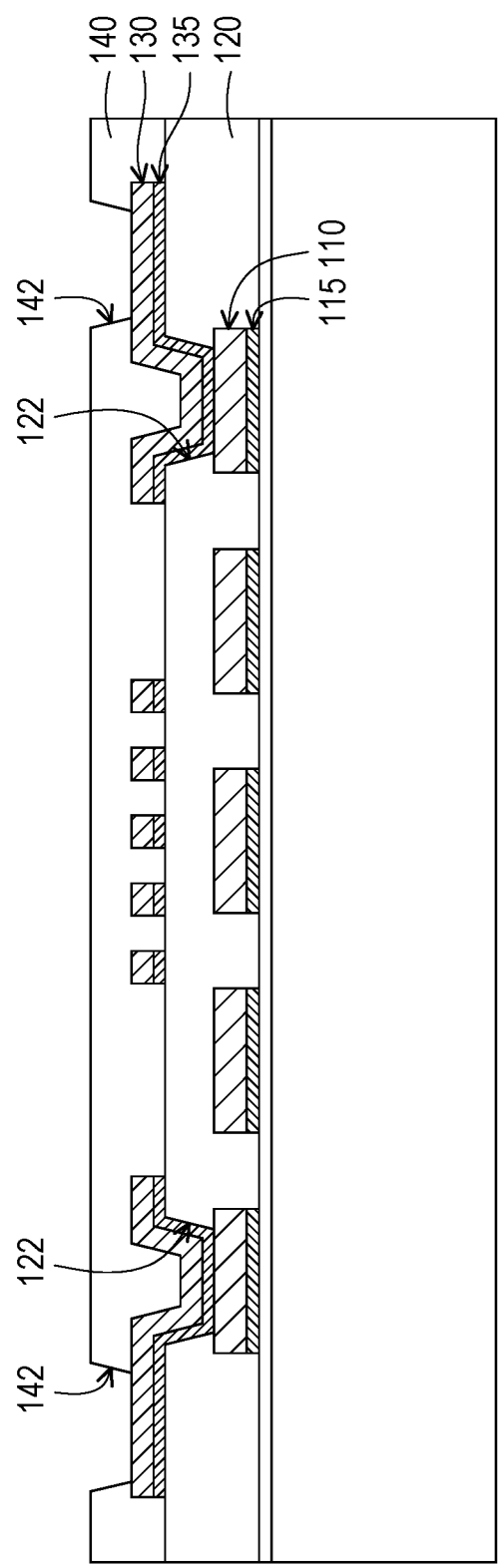

Next, with reference to FIG. 1C, a first patterned seed layer 135 and a first metal layer 130 thereon are formed on the first dielectric layer 120 and the metal layer 110. The first patterned seed layer 135 and the first metal layer 130 thereon are formed on the first dielectric layer 120 and extend into the first openings 122 to be electrically connected to the metal layer 110.

Next, with reference to FIG. 1C again, a second dielectric layer 140 is formed on the first dielectric layer 120. The second dielectric layer 140 covers the first dielectric layer 120 and the first metal layer 130 and has a plurality of second openings 142 exposing part of the first metal layer 130.

Figure 1D:
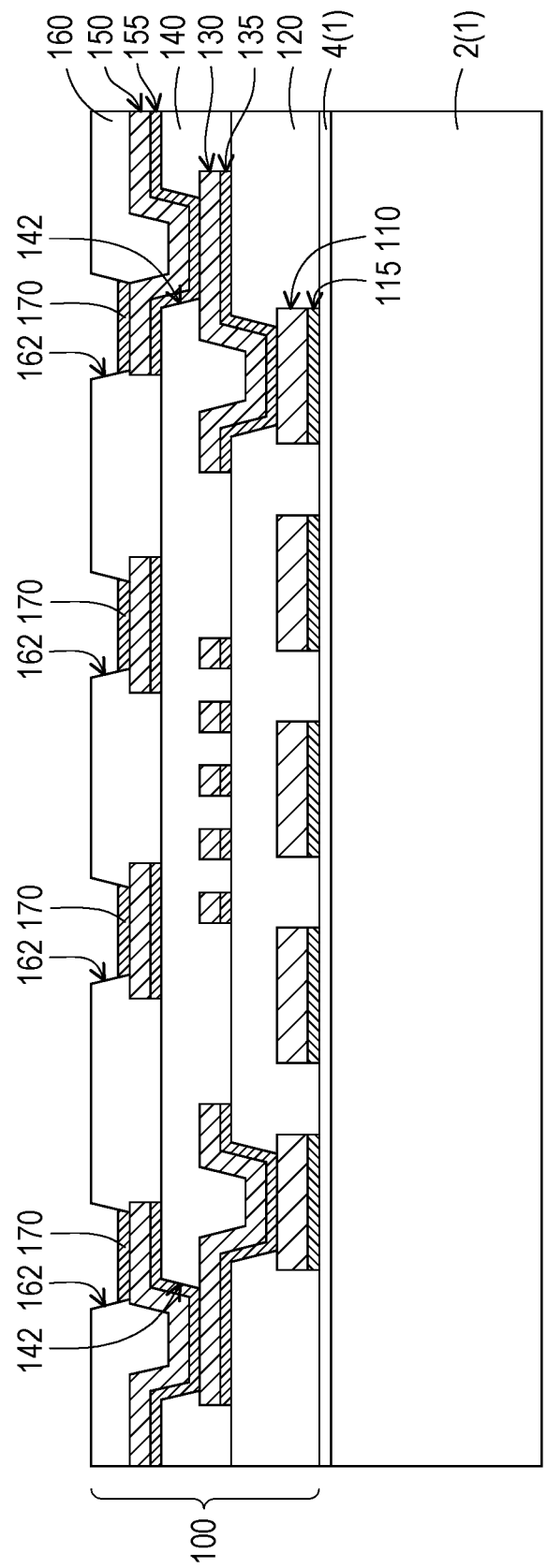

Next, with reference to FIG. 1D, a second patterned seed layer 155 and a second metal layer 150 thereon are formed on the second dielectric layer 140 and in the second openings 142. The second patterned seed layer 155 and the second metal layer 150 thereon are disposed on the second dielectric layer 140 and extend into the second openings 142 to be electrically connected to the first metal layer 130.

Next, with reference to FIG. 1D again, a third dielectric layer 160 is formed on the second dielectric layer 140. The third dielectric layer 160 covers the second dielectric layer 140 and the second metal layer 150 and has a plurality of third openings 162 exposing part of the second metal layer 150. Next, a surface treatment layer 170 is formed on the second metal layer 150 exposed by the third openings 162, and the material of the surface treatment layer 170 includes but not limited to organic solderability preservative (OSP), electroless nickel immersion gold (ENIG), or electroless nickel electroless palladium immersion gold (ENEPIG). A thin film redistribution layer 100 is formed on the temporary carrier 1 so far. Herein, the thin film redistribution layer 100 is formed by the seed layer 115, the metal layer 110, the first dielectric layer 120, the first patterned seed layer 135, the first metal layer 130, the second dielectric layer 140, the second patterned seed layer 155, the second metal layer 150, the third dielectric layer 160, and the surface treatment layer 170.

Figure 1E:
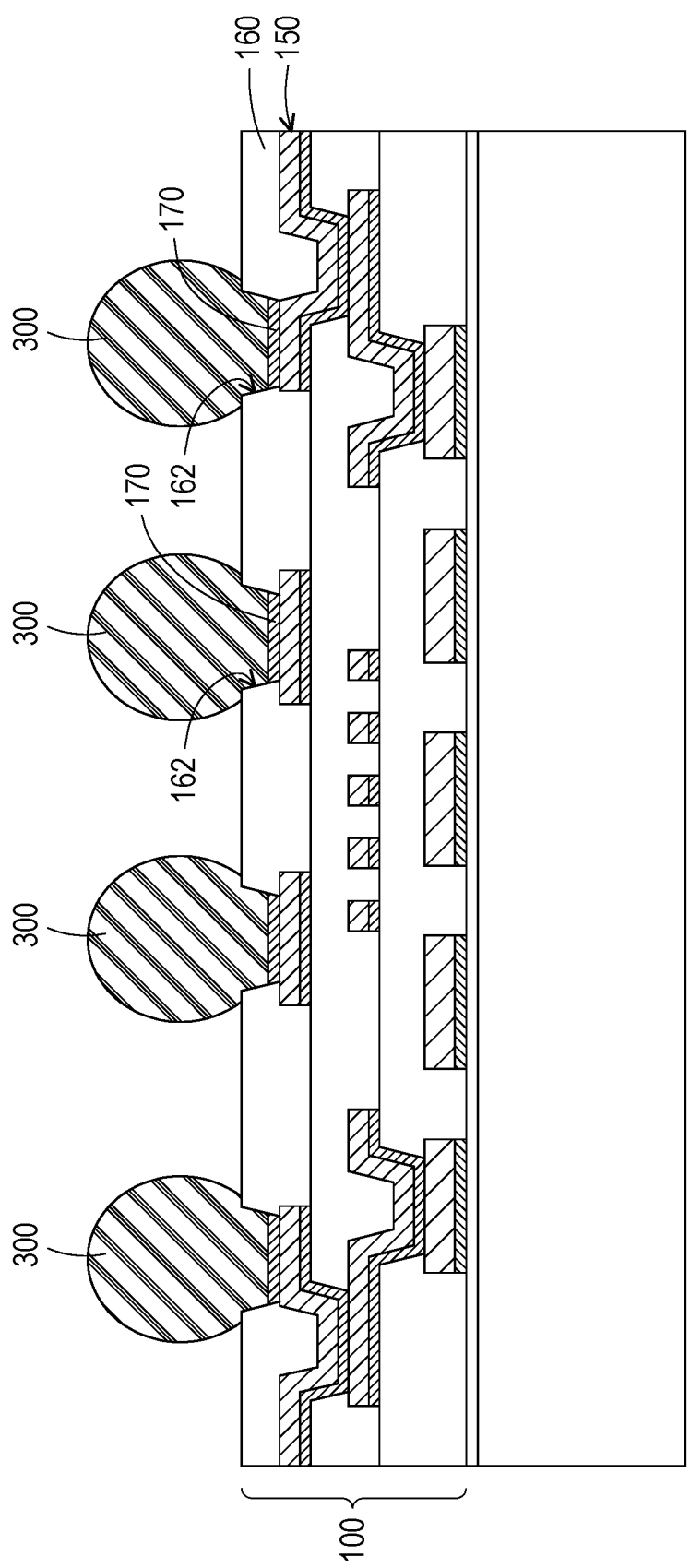

Next, with reference to FIG. 1E, a plurality of solder balls 300 are formed in the third openings 162 of the third dielectric layer 160 of the thin film redistribution layer 100, and the solder balls 300 directly contact the surface treatment layer 170 and are electrically connected to the second metal layer 150.

Figure 1F:
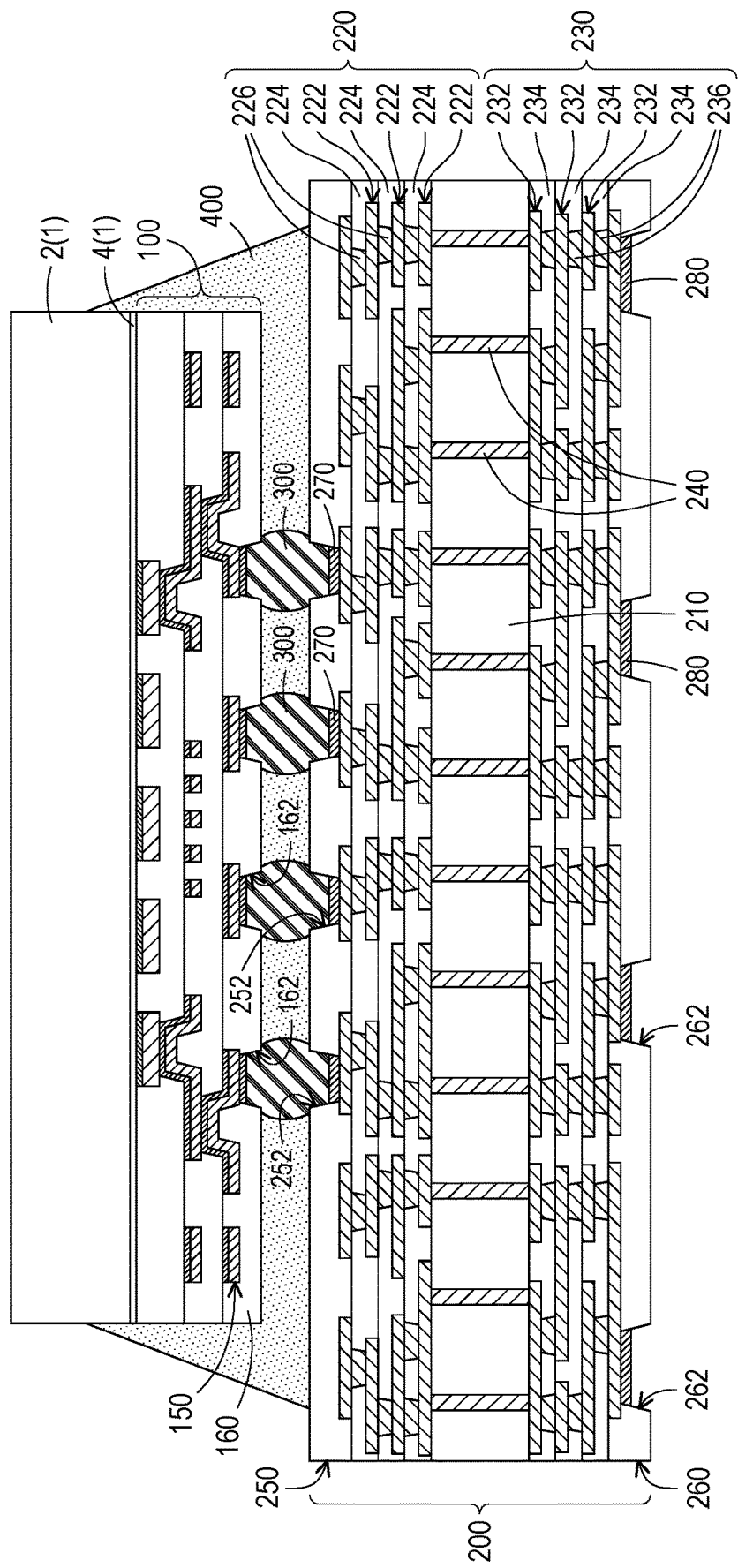

Next, with reference to FIG. 1F, the thin film redistribution layer 100 is assembled onto a carrier 200 through the solder balls 300. The carrier 200 includes a core layer 210, a first build-up circuit layer 220, a second build-up circuit layer 230, a plurality of conductive vias 240, a first solder mask layer 250, a second solder mask layer 260, a first surface treatment layer 270, and a second surface treatment layer 280. The first build-up circuit layer 220 and the second build-up circuit layer 230 are located on opposite sides of the core layer 210 and respectively have multi-layer circuit layers 222 and 232, multi-layer dielectric layers 224 and 234, and a plurality of conductive holes 226 and 236. The circuit layers 222 and 232 are alternately arranged with the dielectric layers 224 and 234, and two adjacent circuit layers 222 and 232 are electrically connected through the corresponding conductive holes 226 and 236. The conductive vias 240 penetrate through the core layer 210 and are electrically connected to the circuit layer 222 of the first build-up circuit layer 220 and the circuit layer 232 of the second build-up circuit layer 230. The first solder mask layer 250 and the second solder mask layer 260 are respectively disposed on the first build-up circuit layer 220 and the second build-up circuit layer 230 and respectively have solder mask openings 252 and 262 exposing the outermost circuit layers 222 and 232. The first surface treatment layer 270 and the second surface treatment layer 280 are respectively disposed on the circuit layers 222 and 232 exposed by the solder mask openings 252 and 262. The solder balls 300 are electrically connected to the second metal layer 150 and the first surface treatment layer 270 located on the circuit layer 222 exposed by the solder mask openings 252, so that the thin film redistribution layer 100 is electrically connected to the carrier 200.

Next, with reference to FIG. 1F again, an underfill 400 is filled between the third dielectric layer 160 of the thin film redistribution layer 100 and the first solder mask layer 250 of the carrier 200 and covers the solder balls 300.

Figure 1G:
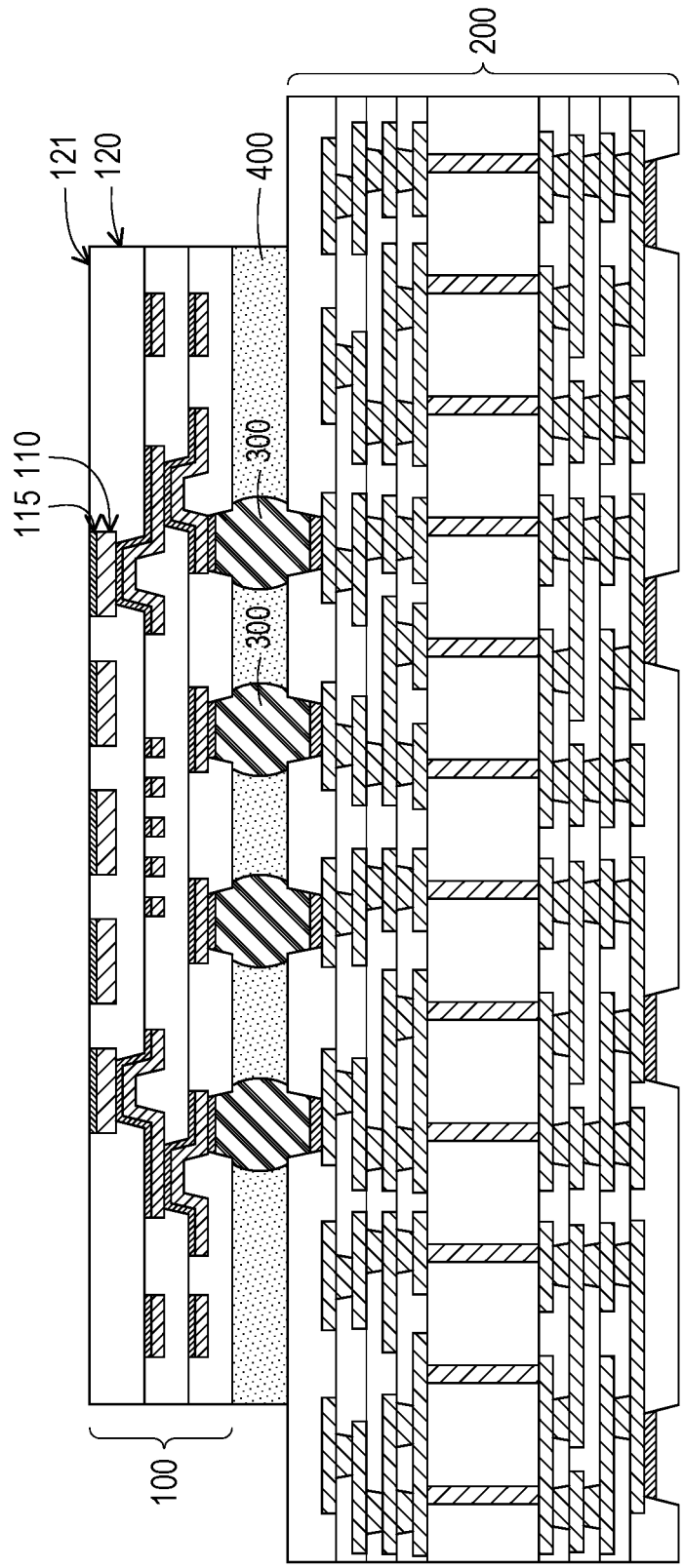

Next, with reference to FIG. 1F and FIG. 1G together, after the thin film redistribution layer 100 is assembled onto the carrier 200, the release film 4 and the glass substrate 2 of the temporary carrier 1 are removed to expose a first surface 121 of the first dielectric layer 120 and the seed layer 115 located on the metal layer 110. For instance, the thin film redistribution layer 100 is separated from the release film 4 and the glass substrate 2 by UV laser, and the temporary carrier 1 is separated by laser trimming or half cutting. Afterwards, plasma may be used to clean/remove the surface of the thin film redistribution layer 100 after the temporary carrier 1 is removed.

Figure 1H:
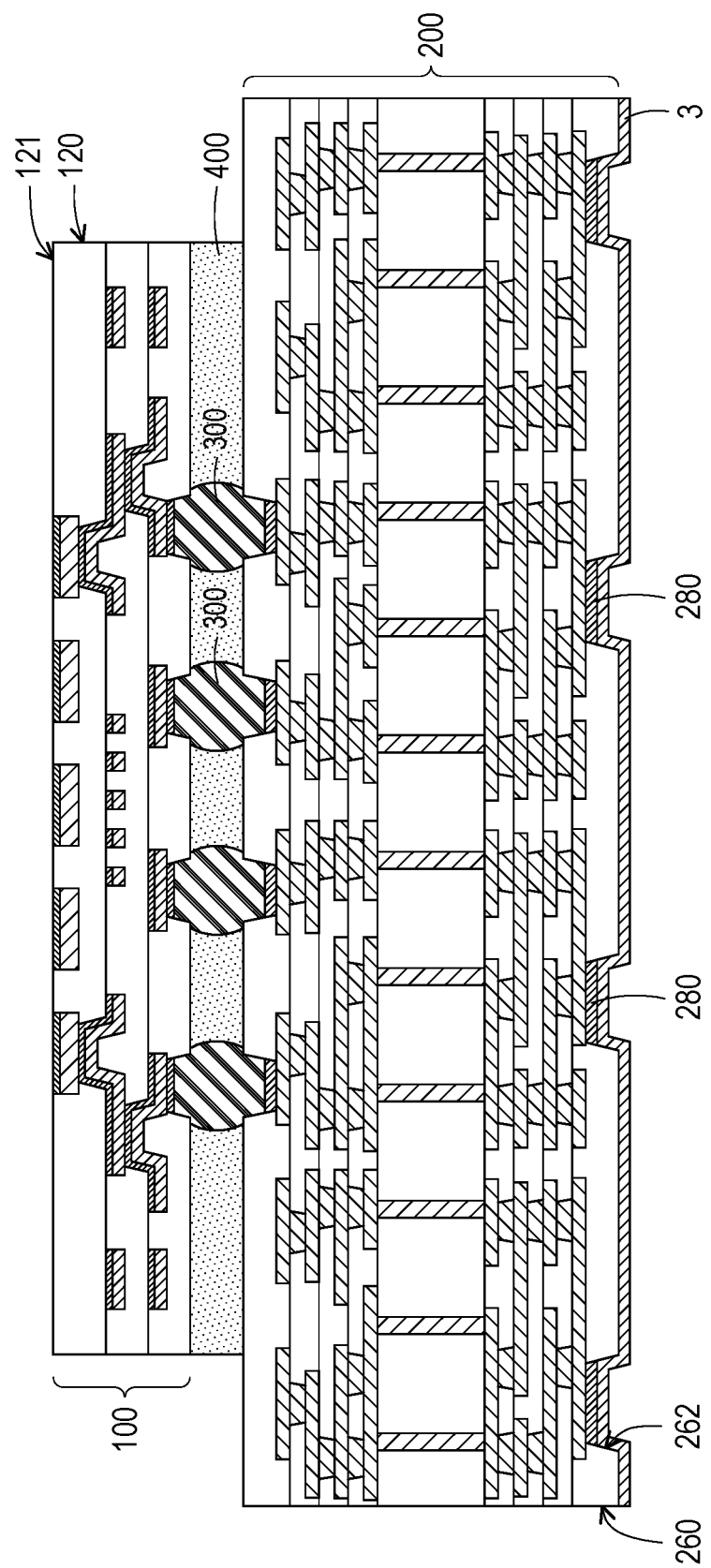

Next, with reference to FIG. 1H, an electroplating seed layer 3 is formed on one side of the carrier 200 relatively away from the thin film redistribution layer 100. The electroplating seed layer 3 is formed on the second solder mask layer 260 and extends to cover the second surface treatment layer 280 located in the solder mask openings 262. Herein, the material of the electroplating seed layer 3 is, for example, titanium/copper or copper, but not limited thereto.

Figure 1I:
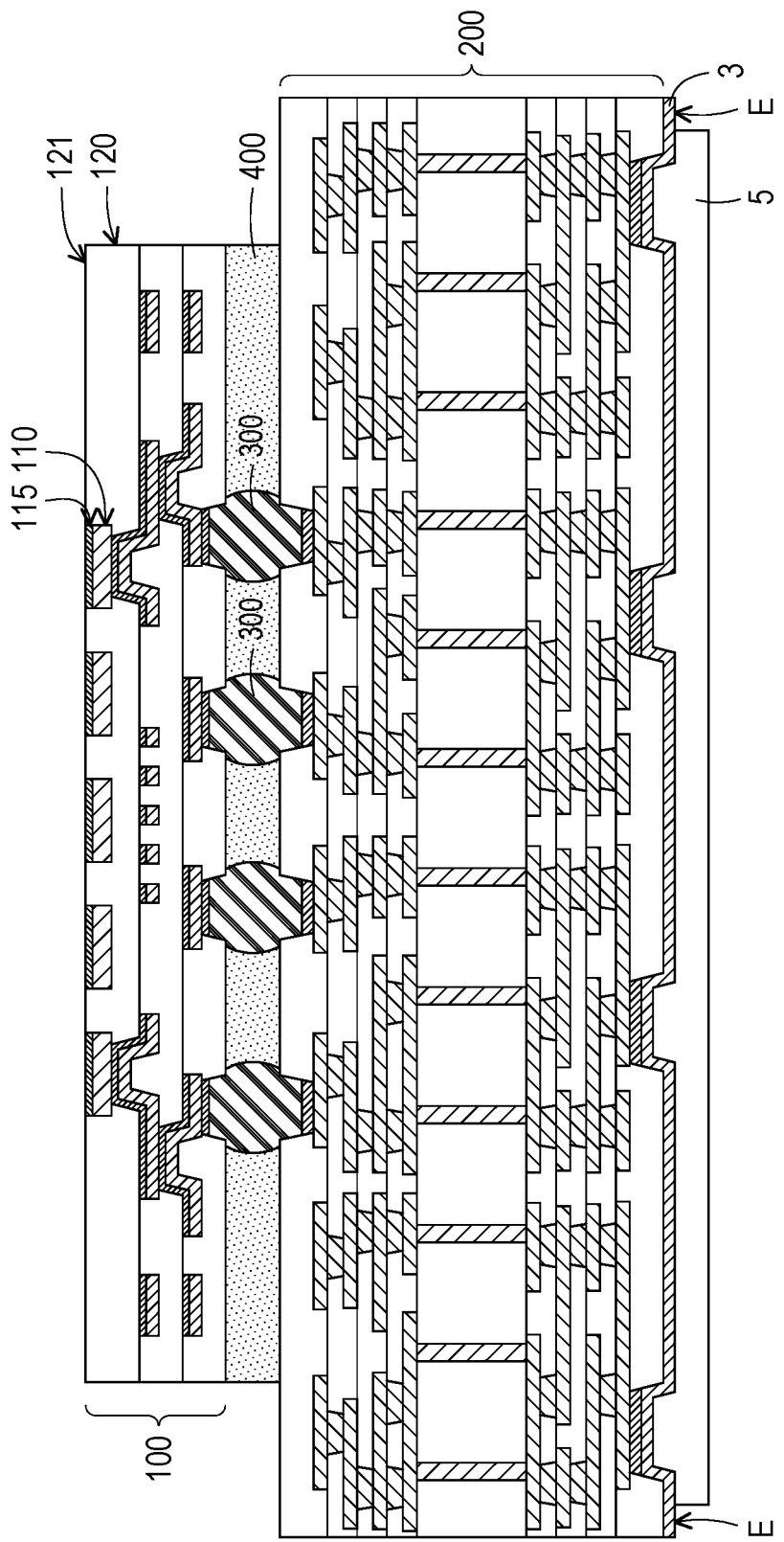

Next, with reference to FIG. 1I, a plating resist layer 5 is formed on the electroplating seed layer 3, and the plating resist layer 5 exposes part of the electroplating seed layer 3 to form a plurality of electroplating contact points E.

Figure 1J:
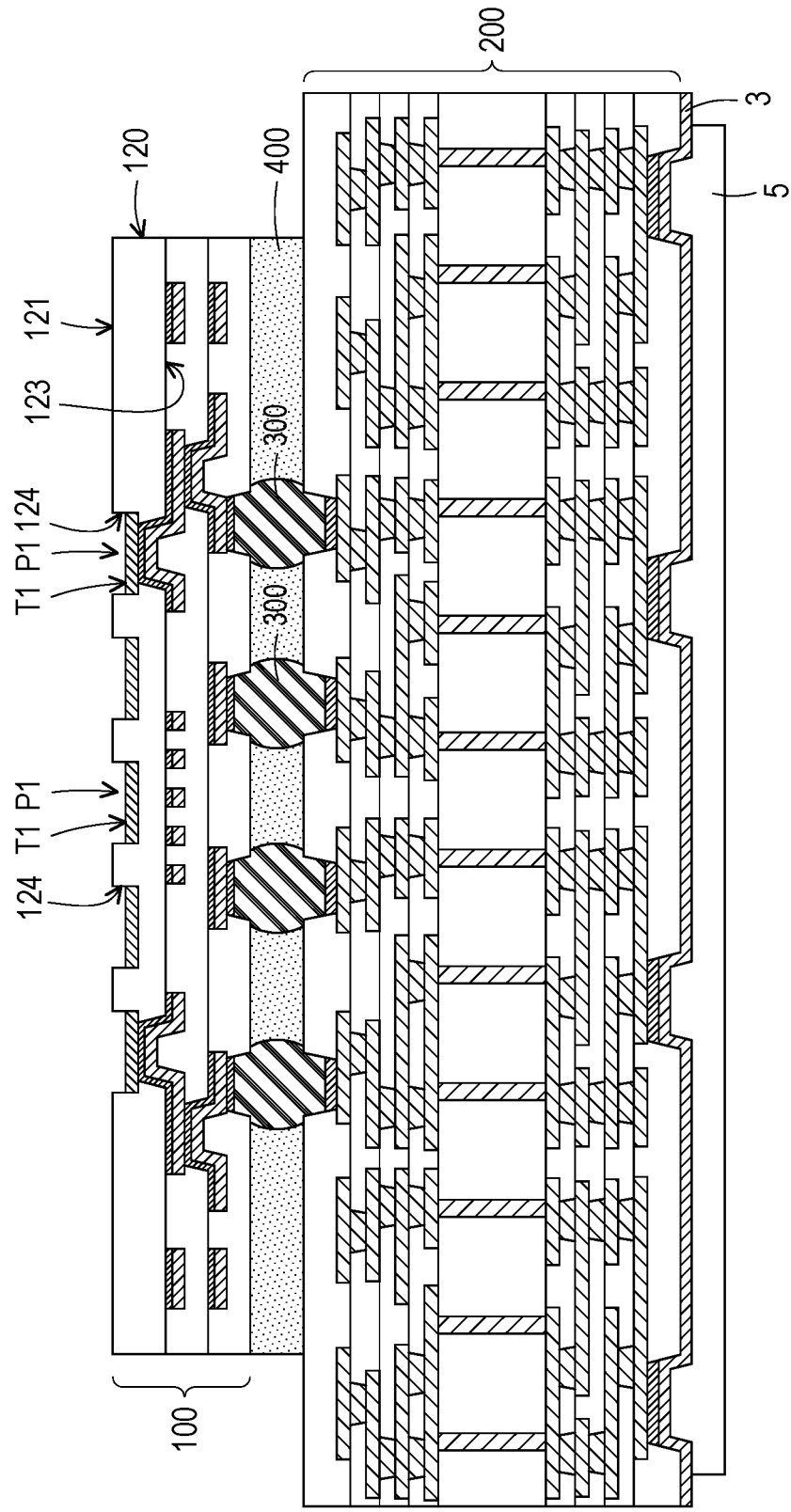

Next, with reference to FIG. 1I and FIG. 1J together, the seed layer 115 and part of the metal layer 110 are removed by etching to form a plurality of pads P1. The first dielectric layer 120 forms a plurality of fourth openings 124 extending from the first surface 121 towards the second surface 123, and the fourth openings 124 expose upper surfaces T1 of the pads P1. That is, the pads P1 are formed by etching part of the metal layer 110. Herein, the first surface 121 of the first dielectric layer 120 is higher than the upper surface T1 of each of the pads P1.

Figure 1K:
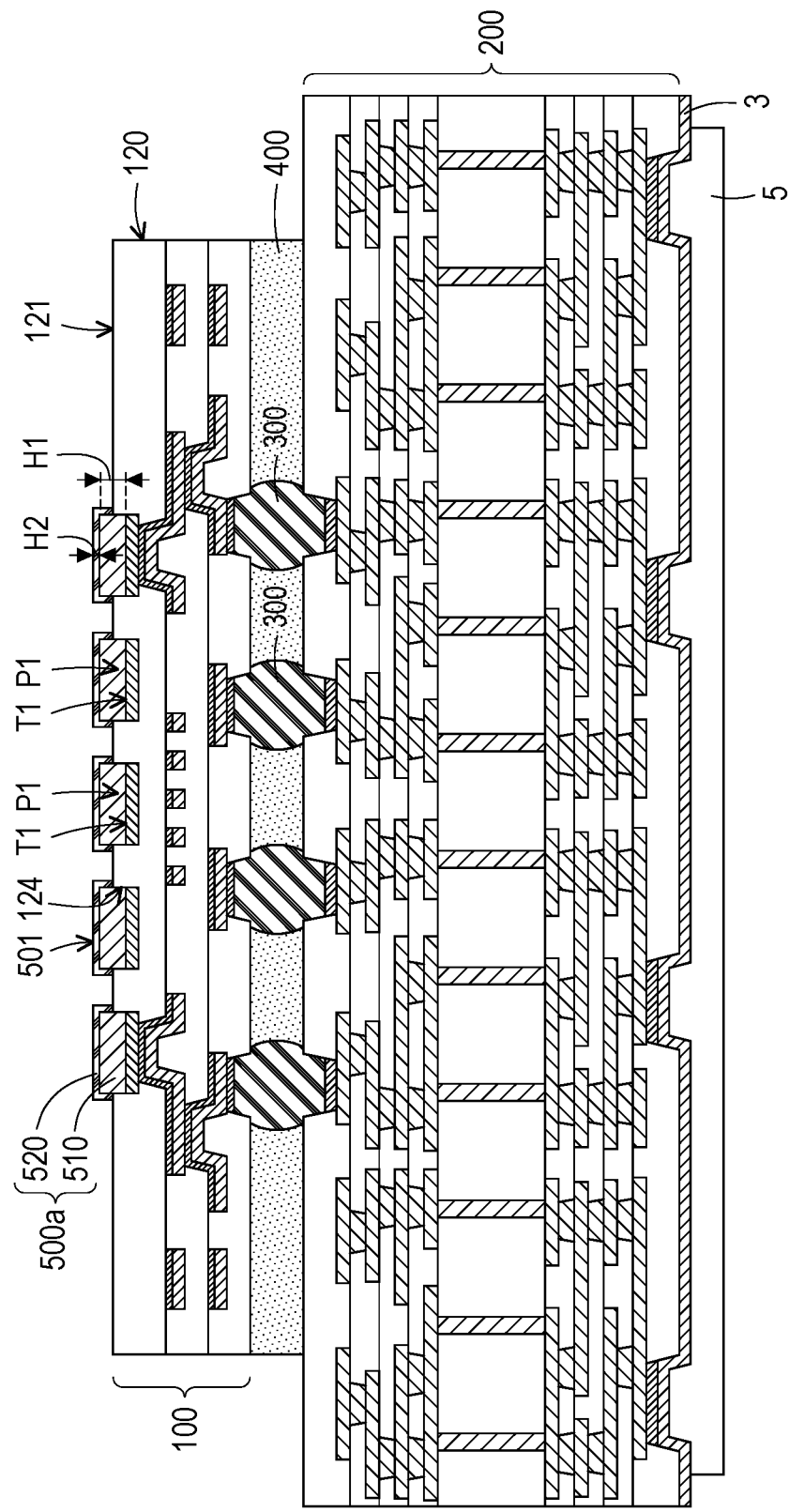

Next, with reference to FIG. 1K, an electroplating process is performed with the electroplating contact points E to form a surface treatment layer 500a on the upper surface T1 of each of the pads P1. Atop surface 501 of the surface treatment layer 500a is higher than the first surface 121 of the first dielectric layer 120. To be specific, in this embodiment, the surface treatment layer 500a includes a first surface treatment layer 510 and a second surface treatment layer 520. The first surface treatment layer 510 is formed in the fourth openings 124 and protrudes from the first surface 121 of the first dielectric layer 120, and the second surface treatment layer 520 covers the first surface treatment layer 510. Herein, a first thickness H1 of the first surface treatment layer 510 is greater than a second thickness H2 of the second surface treatment layer 520. The material of the first surface treatment layer 510 is, for example, nickel, and the material of the second surface treatment layer 520 is, for example, gold. In another embodiment, the material of the surface treatment layer 500a may also be electroless nickel electroless palladium immersion gold (ENEPIG) or electroless palladium immersion gold (EPIG).

Figure 1L:
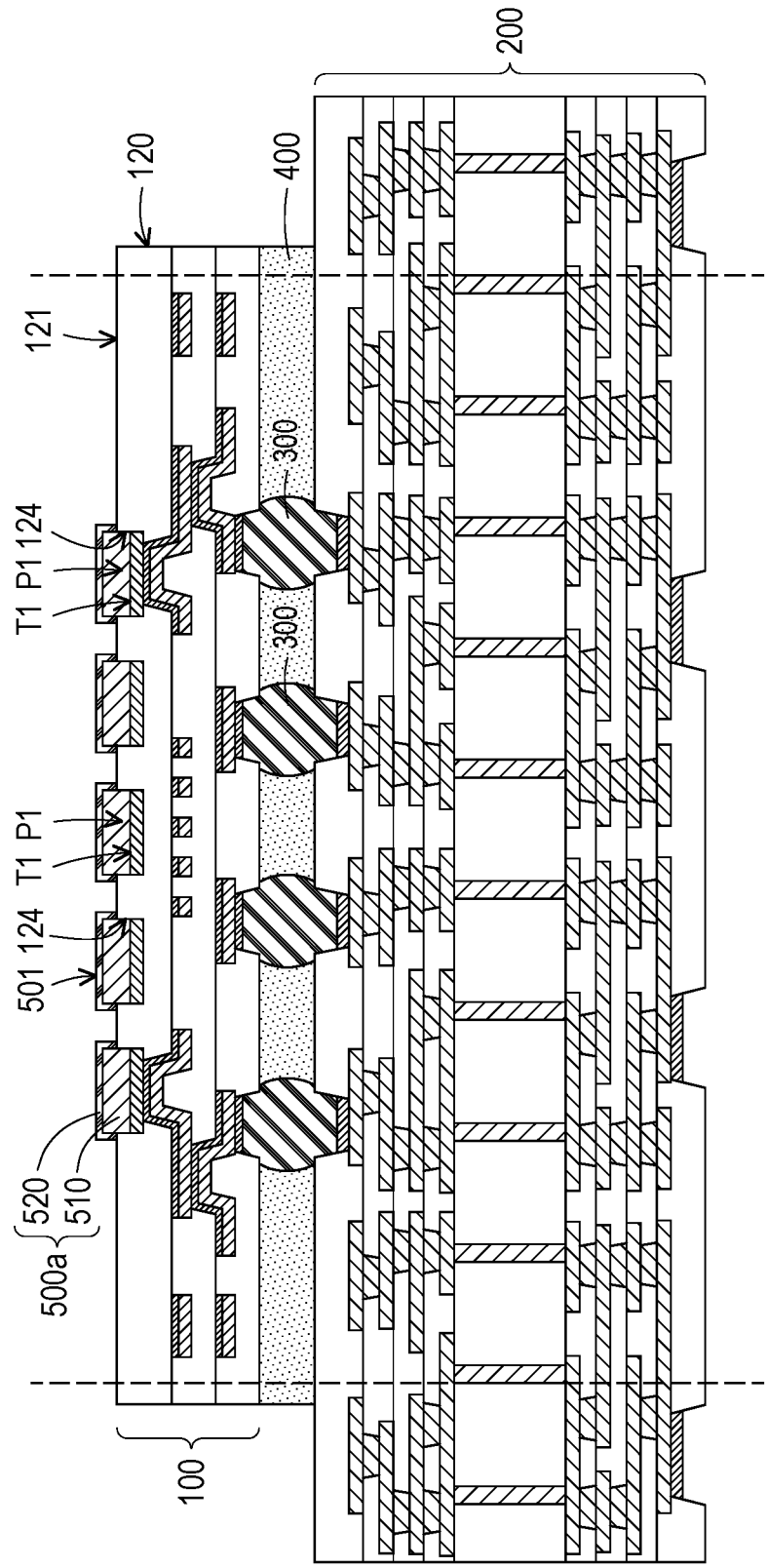

Next, with reference to FIG. 1K and FIG. 1L together, the plating resist layer 5 and the electroplating seed layer 3 are removed to expose one side of the carrier 200 relatively away from the thin film redistribution layer 100.

Figure 1M:
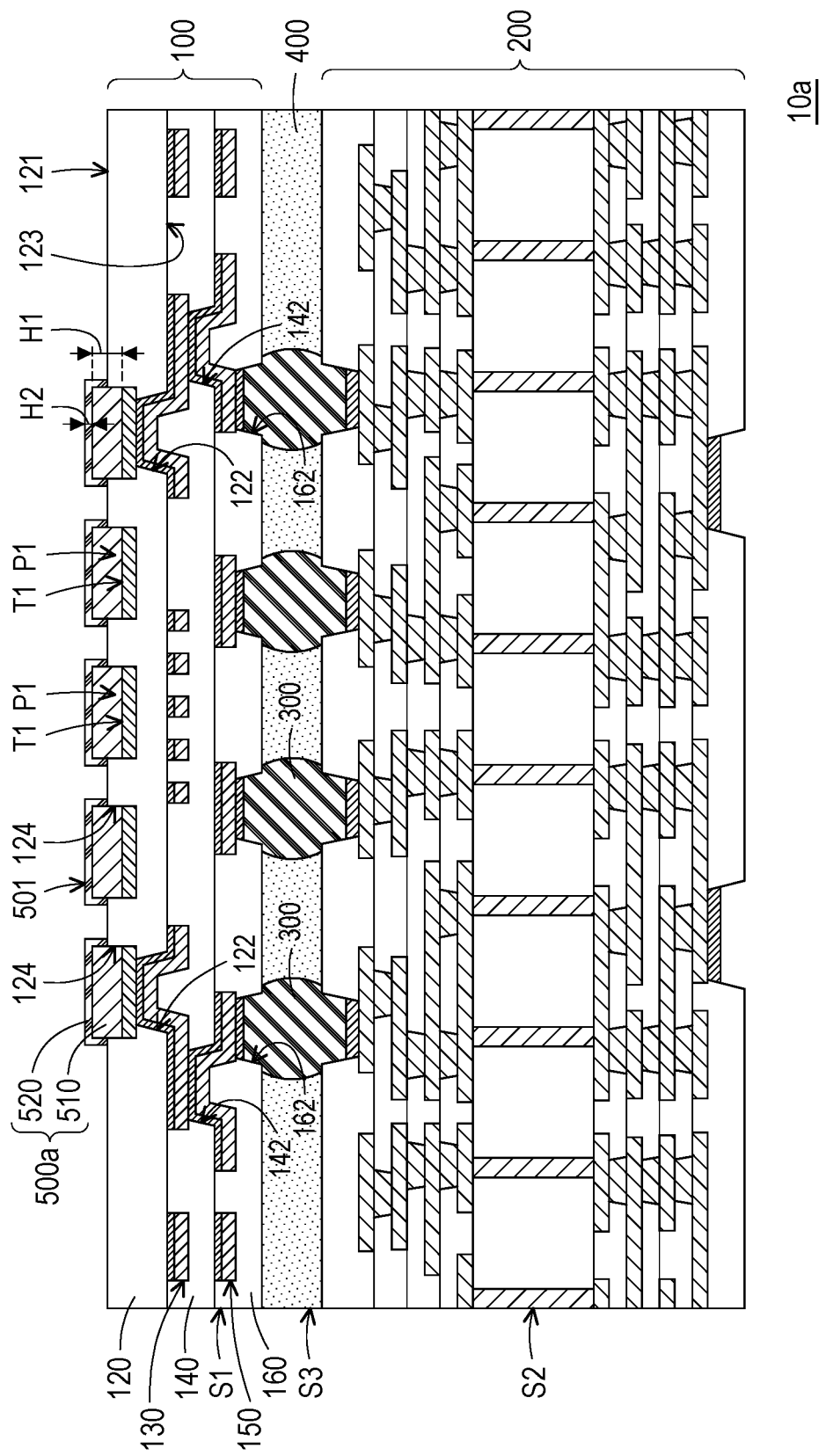

Finally, with reference to FIG. 1L and FIG. 1M together, a singulation process is performed with a wheel cutter to cut the thin film redistribution layer 100, the underfill 400, and the carrier 200, so that a peripheral surface S1 of the thin film redistribution layer 100 is cut to be aligned with a peripheral surface S3 of the underfill 400 and a peripheral surface S2 of the carrier 200. Manufacturing of a circuit board structure 10a is completed so far.

In short, in this embodiment, after the temporary carrier 1 is removed, the metal layer 110 is etched first, and the surface treatment layer 500a is then manufactured. Therefore, when the surface treatment layer 500a is formed, the first dielectric layer 110 may act as a dam to reduce/avoid electrical short circuits due to the bridge issue. Manufacturing of the circuit board structure 10a is completed so far. In an embodiment, the circuit board structure 10a is, for example, a test probe card, but not limited thereto.

Structurally, with reference to FIG. 1M again, in this embodiment, the circuit board structure 10a includes the thin film redistribution layer 100, the carrier 200, the solder balls 300, and the surface treatment layer 500a. The thin film redistribution layer 100 is disposed on the carrier 200. The thin film redistribution layer 100 includes the pads P1, the first dielectric layer 120, the first metal layer 130, the second dielectric layer 140, the second metal layer 150, and the third dielectric layer 160. The first dielectric layer 120 has the first surface 121 and the second surface 123 opposite to each other and the first openings 122 extending from the second surface 123 towards the first surface 121. The first openings 122 expose part of the pads P1, and the first surface 121 is higher than the upper surface T1 of each of the pads P1. Herein, the first dielectric layer 120 also has the fourth openings 124 extending from the first surface 121 towards the second surface 123, and the fourth openings 124 exposes at least the upper surface T1 of each of the pads P1. The first metal layer 130 is disposed on the second surface 123 of the first dielectric layer 120 and extends into the first openings 122. The second dielectric layer 140 covers the first dielectric layer 120 and the first metal layer 130 and has the second openings 142 exposing part of the first metal layer 130. The second metal layer 150 is disposed on the second dielectric layer 140, extends into the second openings 142, and is electrically connected to the first metal layer 130. The third dielectric layer 160 covers the second dielectric layer 140 and the second metal layer 150 and has the third openings 162 exposing part of the second metal layer 150.

Further, the solder balls 300 are disposed in the third openings 162 of the third dielectric layer 160 of the thin film redistribution layer 100, and the solder balls 300 are electrically connected to the second metal layer 150 of the thin film redistribution layer 100 and the carrier 200. The surface treatment layer 500a is disposed on the upper surface T1 of each of the pads P1, and the top surface 501 of the surface treatment layer 500a is higher than the first surface 121 of the first dielectric layer 120. Herein, the surface treatment layer 500a includes the first surface treatment layer 510 and the second surface treatment layer 520. The first surface treatment layer 510 is disposed in each of the fourth openings 124 and protrudes from the first surface 121 of the first dielectric layer 120. The second surface treatment layer 520 covers the first surface treatment layer 510. The first thickness H1 of the first surface treatment layer 510 is greater than the second thickness H2 of the second surface treatment layer 520. Further, in this embodiment, the circuit board structure 10a also includes the underfill 400 filled between the third dielectric layer 160 of the thin film redistribution layer 100 and the carrier 200 and covers the solder balls 300. Herein, the peripheral surface S1 of the thin film redistribution layer 100 is aligned with the peripheral surface S3 of the underfill 400 and the peripheral surface S2 of the carrier 200.

In short, in the design of the circuit board structure 10a of this embodiment, the first surface 121 of the first dielectric layer 120 is higher than the upper surface T1 of each of the pads P1. That is, the first dielectric layer 120 may be regarded as a dam, which can effectively prevent the surface treatment layer 500a subsequently formed on the pads P1 from being electrically short-circuited due to the bridge issue caused by the fine space. Therefore, the circuit board structure 10a of this embodiment may exhibit good structural reliability.

Other embodiments are described for illustration in the following. It should be noted that the reference numerals and a part of the contents in the previous embodiments are used in the following embodiments, in which identical reference numerals indicate identical or similar components, and repeated description of the same technical content is omitted. Please refer to the description of the previous embodiments for the omitted content, which will not be repeated hereinafter.

Figure 2:
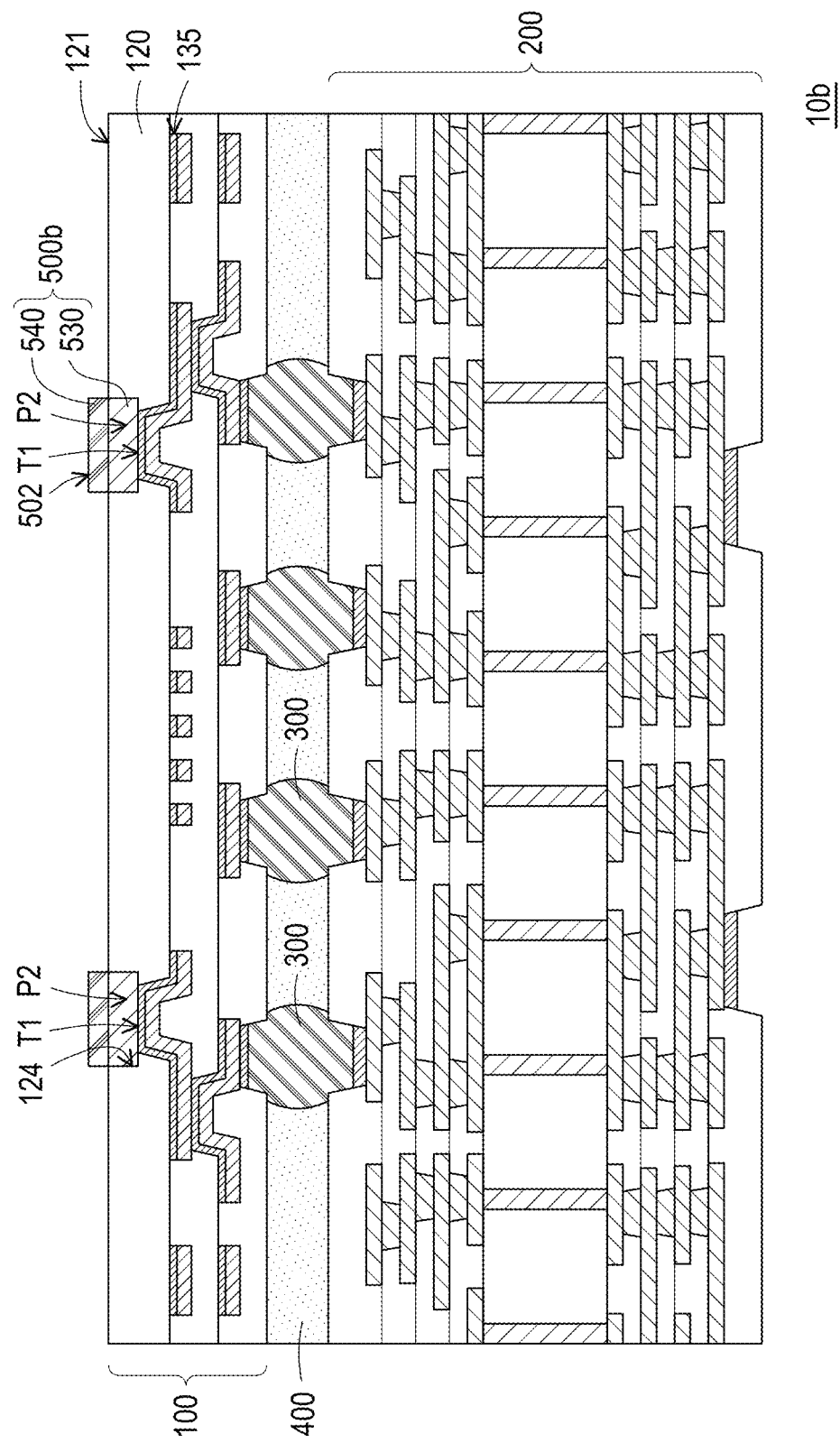
FIG. 2 is a cross-sectional schematic view of a circuit board structure according to an embodiment of the disclosure.

FIG. 2 is a cross-sectional schematic view of a circuit board structure according to an embodiment of the disclosure. With reference to FIG. 1M and FIG. 2 together, a circuit board structure 10b of this embodiment is similar to the circuit board structure 10a in FIG. 1M, but the main differences therebetween are that: in the step of FIG. 1J, the seed layer 115 (with reference to FIG. 1I) and the metal layer 110 (with reference to FIG. 1I) are completely removed by etching, and part of the first patterned seed layer 135 is exposed to be defined as pads P2. In this etching step, the first patterned seed layer 135 may act as an etch stop layer for etching the metal layer 110. The first surface treatment layer 530 is formed in each of the fourth openings 124 and is aligned with the first surface 121 of the first dielectric layer 120, and the second surface treatment layer 540 is formed on the first surface treatment layer 530. Herein, a surface 502 of a surface treatment layer 500b protrudes from the first surface 121 of the first dielectric layer 120. In this embodiment, the metal layer 110 is completely removed, and the exposed first patterned seed layer 135 is defined as the pads P2. Therefore, more space may be added to form the surface treatment layer 500b, and the surface wear resistance may be improved.

Figure 3:
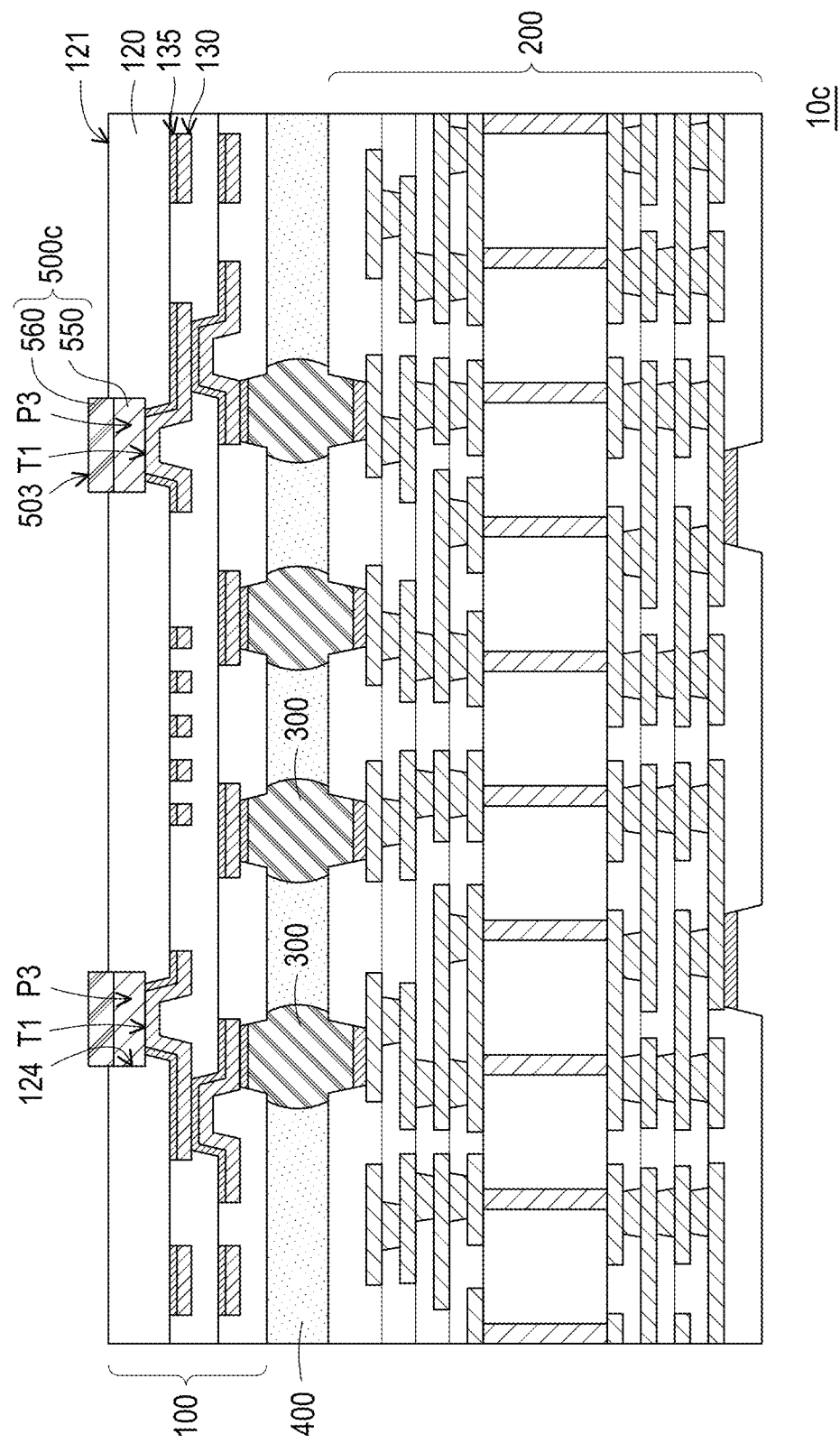
FIG. 3 is a cross-sectional schematic view of a circuit board structure according to another embodiment of the disclosure.

FIG. 3 is a cross-sectional schematic view of a circuit board structure according to an embodiment of the disclosure. With reference to FIG. 1M and FIG. 3 together, a circuit board structure 10c of this embodiment is similar to the circuit board structure 10a in FIG. 1M, but the main differences therebetween are that: in the step of FIG. 1J, the seed layer 115 (with reference to FIG. 1I), the metal layer 110 (with reference to FIG. 1I), and part of the first patterned seed layer 135 are completely removed by etching, and part of the first metal layer 130 is exposed to be defined as pads P3. In this etching step, the first patterned seed layer 135 and the first metal layer 130 may respectively act as etch stop layers for etching the metal layer 110 and etching the first patterned seed layer 135. A first surface treatment layer 550 is formed in each of the fourth openings 124 and is slightly lower than the first surface 121 of the first dielectric layer 120, and a second surface treatment layer 560 is formed on the first surface treatment layer 550 and protrudes from the first surface 121 of the first dielectric layer 120. Herein, a surface 503 of a surface treatment layer 500c protrudes from the first surface 121 of the first dielectric layer 120. In this embodiment, the metal layer 110 and part of the first patterned seed layer 135 are completely removed, and the exposed first metal layer 130 is defined as the pads P3, so the influence on the signal may be excluded.

In view of the foregoing, in the design of the circuit board structure provided by the disclosure, the first surface of the first dielectric layer is higher than the upper surface of each of the pads. That is, the first dielectric layer may be regarded as a dam, which can effectively prevent the surface treatment layer subsequently formed on the pads from being electrically short-circuited due to the bridge issue caused by the fine space. Therefore, the circuit board structure provided by the disclosure may exhibit good structural reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit board structure, comprising:
a carrier;
a thin film redistribution layer disposed on the carrier, wherein the thin film redistribution layer comprises a plurality of pads, a first dielectric layer, a first metal layer, a second dielectric layer, a second metal layer, and a third dielectric layer, the first dielectric layer has a first surface and a second surface opposite to each other and a plurality of first openings extending from the second surface towards the first surface, the first openings expose part of the pads, the first surface is higher than an upper surface of each of the pads, the first metal layer is disposed on the second surface of the first dielectric layer and extends into the first openings, the second dielectric layer covers the first dielectric layer and the first metal layer and has a plurality of second openings exposing part of the first metal layer, the second metal layer is disposed on the second dielectric layer, extends into the second openings, and is electrically connected to the first metal layer, and the third dielectric layer covers the second dielectric layer and the second metal layer and has a plurality of third openings exposing part of the second metal layer;
a plurality of solder balls disposed in the third openings of the third dielectric layer of the thin film redistribution layer, wherein the solder balls are electrically connected to second metal layer of the thin film redistribution layer and the carrier; and
a surface treatment layer disposed on the upper surface of each of the pads, wherein a top surface of the surface treatment layer is higher than the first surface of the first dielectric layer, wherein the surface treatment layer comprises a first surface treatment layer and a second surface treatment layer, and a first thickness of the first surface treatment layer is greater than a second thickness of the second surface treatment layer.

2. The circuit board structure according to claim 1, wherein the first dielectric layer further comprises a plurality of fourth openings extending from the first surface towards the second surface, the fourth openings at least expose the upper surfaces of the pads, the first surface treatment layer is disposed in each of the fourth openings and protrudes from the first surface of the first dielectric layer, and the second surface treatment layer covers the first surface treatment layer.

3. The circuit board structure according to claim 1, wherein the first dielectric layer further comprises a plurality of fourth openings extending from the first surface towards the second surface, the fourth openings expose part of the first metal layer and are defined as the pads, the first surface treatment layer is disposed in each of the fourth openings, and the second surface treatment layer is disposed on the first surface treatment layer and protrudes from the first surface of the first dielectric layer.

4. The circuit board structure according to claim 1, further comprising:
a patterned seed layer disposed on the first metal layer, wherein the first dielectric layer further comprises a plurality of fourth openings extending from the first surface towards the second surface, the fourth openings expose part of the patterned seed layer and are defined as the pads, the first surface treatment layer is disposed in each of the fourth openings and is aligned with the first surface of the first dielectric layer, and the second surface treatment layer is disposed on the first surface treatment layer.

5. The circuit board structure according to claim 1, further comprising:
an underfill filled between the third dielectric layer of the thin film redistribution layer and the carrier and covering the solder balls.

6. The circuit board structure according to claim 5, wherein a peripheral surface of the thin film redistribution layer is aligned with a peripheral surface of the underfill and a peripheral surface of the carrier.

7. A manufacturing method of a circuit board structure, comprising:
forming a thin film redistribution layer on a temporary carrier, wherein the thin film redistribution layer comprises a metal layer, a first dielectric layer, a first metal layer, a second dielectric layer, a second metal layer, and a third dielectric layer, the metal layer and the first dielectric layer are formed on the temporary carrier, the first dielectric layer has a plurality of first openings exposing part of the metal layer, the first metal layer is formed on the first dielectric layer, extends into the first openings, and is electrically connected to the metal layer, the second dielectric layer covers the first dielectric layer and the first metal layer and has a plurality of second openings exposing part of the first metal layer, the second metal layer is disposed on the second dielectric layer, extends into the second openings, and is electrically connected to the first metal layer, and the third dielectric layer covers the second dielectric layer and the second metal layer and has a plurality of third openings exposing part of the second metal layer;

assembling the thin film redistribution layer onto a carrier through a plurality of solder balls, wherein the solder balls are located in the third openings of the third dielectric layer, and the solder balls are electrically connected to the second metal layer and the carrier;

removing the temporary carrier to expose a first surface of the first dielectric layer and the metal layer and removing at least part of the metal layer to form a plurality of pads after assembling the thin film redistribution layer onto the carrier, wherein the first surface of the first dielectric layer is higher than an upper surface of each of the pads; and forming a surface treatment layer on the upper surface of each of the pads, wherein a top surface of the surface treatment layer is higher than the first surface of the first dielectric layer.

8. The manufacturing method of the circuit board structure according to claim 7, wherein the temporary carrier comprises a glass substrate, a release film, and a seed layer, the release film is located between the glass substrate and the seed layer, and the step of forming the thin film redistribution layer on the temporary carrier comprises:

forming the metal layer on the seed layer;

forming the first dielectric layer on the release film, wherein the first dielectric layer covers the metal layer, and the first openings expose part of the metal layer;

forming a first patterned seed layer and the first metal layer thereon on the first dielectric layer and the metal layer;

forming the second dielectric layer on the first dielectric layer;

forming a second patterned seed layer and the second metal layer thereon on the second dielectric layer and in the second openings; and forming the third dielectric layer on the second dielectric layer.

9. The manufacturing method of the circuit board structure according to claim 8, further comprising:

forming an electroplating seed layer on a side of the carrier relatively away from the thin film redistribution layer after removing the temporary carrier and before removing at least part of the metal layer to form the pads; and forming a plating resist layer on the electroplating seed layer and exposing part of the electroplating seed layer to form a plurality of electroplating contact points.

10. The manufacturing method of the circuit board structure according to claim 9, wherein the step of forming the surface treatment layer comprises:

performing an electroplating process with the electroplating contact points to form the surface treatment layer on the upper surface of each of the pads, wherein the surface treatment layer comprises a first surface treatment layer and a second surface treatment layer, and a first thickness of the first surface treatment layer is greater than a second thickness of the second surface treatment layer.

11. The manufacturing method of the circuit board structure according to claim 10, wherein the step of removing at least part of the metal layer comprises:

removing the seed layer and part of the metal layer by etching to form the pads, wherein the first dielectric layer forms a plurality of fourth openings extending from the first surface towards the second surface, the fourth openings at least expose the upper surface of each of the pads, the first surface treatment layer is formed in each of the fourth openings and protrudes from the first surface of the first dielectric layer, and the second surface treatment layer covers the first surface treatment layer.

12. The manufacturing method of the circuit board structure according to claim 10, wherein the step of removing at least part of the metal layer comprises:

completely removing the seed layer, the metal layer, and part of the first patterned seed layer by etching and exposing part of the first metal layer to be defined as the pads, wherein the first dielectric layer forms a plurality of fourth openings extending from the first surface towards the second surface, the fourth openings at least expose the upper surface of each of the pads, the first surface treatment layer is formed in each of the fourth openings, and the second surface treatment layer is formed on the first surface treatment layer and protrudes from the first surface of the first dielectric layer.

13. The manufacturing method of the circuit board structure according to claim 10, wherein the step of removing at least part of the metal layer comprises:

completely removing the seed layer and the metal layer by etching and exposing part of the first patterned seed layer to be defined as the pads, wherein the first dielectric layer forms a plurality of fourth openings extending from the first surface towards the second surface, the fourth openings at least expose the upper surface of each of the pads, the first surface treatment layer is formed in each of the fourth openings and is aligned with the first surface of the first dielectric layer, and the second surface treatment layer is formed on the first surface treatment layer.

14. The manufacturing method of the circuit board structure according to claim 7, further comprising:

filling an underfill between the third dielectric layer of the thin film redistribution layer and the carrier and covering the solder balls before removing the temporary carrier.

15. The manufacturing method of the circuit board structure according to claim 14, further comprising:

performing a singulation process to cut the thin film redistribution layer, the underfill, and the carrier after the step of forming the surface treatment layer, so that a peripheral surface of the thin film redistribution layer is aligned with a peripheral surface of the underfill and a peripheral surface of the carrier.

16. A circuit board structure, comprising:

a thin film redistribution layer comprising a plurality of pads, a first dielectric layer, a first metal layer, a second dielectric layer, a second metal layer, and a third dielectric layer, the first dielectric layer has a first surface and a second surface opposite to each other and a plurality of first openings extending from the second surface towards the first surface, the first openings expose part of the pads, the first surface is higher than an upper surface of each of the pads, the first metal layer is disposed on the second surface of the first dielectric layer and extends into the first openings, the second dielectric layer covers the first dielectric layer and the first metal layer and has a plurality of second openings exposing part of the first metal layer, the second metal layer is disposed on the second dielectric layer, extends into the second openings, and is electrically connected to the first metal layer, and the third dielectric layer covers the second dielectric layer and the second metal layer and has a plurality of third openings exposing part of the second metal layer; and a surface treatment layer disposed on the upper surface of each of the pads, wherein a top surface of the surface treatment layer is higher than the first surface of the first dielectric layer, wherein the surface treatment layer comprises a first surface treatment layer and a second surface treatment layer, and a first thickness of the first surface treatment layer is greater than a second thickness of the second surface treatment layer.

* * * * *